US012581785B2

(12) United States Patent
Hsueh et al.

(10) Patent No.: US 12,581,785 B2
(45) Date of Patent: Mar. 17, 2026

(54) OPTOELECTRONIC DEVICE

(71) Applicant: EPISTAR CORPORATION, Hsinchu (TW)

(72) Inventors: Wei-Jen Hsueh, Hsinchu (TW); Shih-Chang Lee, Hsinchu (TW); Chen Ou, Hsinchu (TW); Po-Chou Pan, Hsinchu (TW); Wen-Luh Liao, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 734 days.

(21) Appl. No.: 17/940,361

(22) Filed: Sep. 8, 2022

(65) Prior Publication Data

US 2023/0074033 A1     Mar. 9, 2023

(30) Foreign Application Priority Data

Sep. 9, 2021     (TW) ................................. 110133573

(51) Int. Cl.
    *H01L 27/15*         (2006.01)
    *H10F 39/10*         (2025.01)
    *H10H 29/10*         (2025.01)
(52) U.S. Cl.
    CPC ........... *H10H 29/10* (2025.01); *H10F 39/103* (2025.01)
(58) Field of Classification Search
    CPC .... H10H 29/10; H10H 20/819; H10H 20/831; H10F 39/103; H10F 30/288; H10F 77/413
    See application file for complete search history.

(56) References Cited

U.S. PATENT DOCUMENTS

| | | | | | |
|---|---|---|---|---|---|
| 4,786,951 | A | * | 11/1988 | Tokuda | H10H 20/812 |
| | | | | | 372/96 |
| 5,144,397 | A | * | 9/1992 | Tokuda | B82Y 20/00 |
| | | | | | 257/14 |
| 5,187,715 | A | * | 2/1993 | Weisbuch | G02F 1/3556 |
| | | | | | 257/17 |
| 5,329,136 | A | * | 7/1994 | Goossen | H10F 77/306 |
| | | | | | 257/17 |
| 5,506,418 | A | * | 4/1996 | Bois | H10F 77/146 |
| | | | | | 257/17 |
| 5,552,603 | A | * | 9/1996 | Stokes | H10F 39/1825 |
| | | | | | 257/E27.128 |

(Continued)

*Primary Examiner* — Jarrett J Stark

(74) *Attorney, Agent, or Firm* — MUNCY, GEISSLER, OLDS & LOWE, P.C.

(57)     ABSTRACT

An optoelectronic device includes a substrate, a first semiconductor stack located on the substrate, a second semiconductor stack located on the first semiconductor stack, and a first optical structure located between the first semiconductor stack and the second semiconductor stack. The first semiconductor stack includes a first semiconductor layer, a second semiconductor layer and a first active layer which emits or absorbs a first light with a first wavelength. The second semiconductor stack includes a third semiconductor layer, a fourth semiconductor layer and a second active layer which emits or absorbs a second light with a second wavelength smaller than the first wavelength. The first optical structure includes a plurality of first parts and a plurality of second parts. The first parts and the second parts are alternately arranged by a first period along a horizontal direction parallel to the substrate.

20 Claims, 5 Drawing Sheets

(56) References Cited

U.S. PATENT DOCUMENTS

| | | | | |
|---|---|---|---|---|
| 5,581,084 A * | 12/1996 | Chapman | H10F 30/2212 | 250/370.06 |
| 5,731,621 A * | 3/1998 | Kosai | B82Y 20/00 | 257/443 |
| 6,147,901 A * | 11/2000 | Sakata | G11C 13/04 | 365/175 |
| 6,157,020 A * | 12/2000 | Krapf | H10F 39/1843 | 257/E27.137 |
| 6,407,439 B1 * | 6/2002 | Hier | H10F 30/21 | 257/E31.022 |
| 6,504,222 B1 * | 1/2003 | Miyamoto | H10F 77/146 | 257/466 |
| 7,009,215 B2 * | 3/2006 | D'Evelyn | H10H 20/01335 | 372/98 |
| 7,329,895 B2 * | 2/2008 | Cole | H10F 77/337 | 257/E31.022 |
| 7,521,658 B2 * | 4/2009 | Matthews | H10F 30/10 | 250/214.1 |
| 7,525,083 B2 * | 4/2009 | Jaeger | G01J 3/513 | 250/226 |
| 8,093,559 B1 * | 1/2012 | Rajavel | H10F 39/021 | 257/190 |
| 9,755,091 B2 | 9/2017 | Delaunay | | |
| 2011/0204376 A1 * | 8/2011 | Su | H01L 25/0756 | 438/46 |
| 2012/0094414 A1 * | 4/2012 | Or-Bach | H10F 10/163 | 438/33 |
| 2013/0264587 A1 * | 10/2013 | Chang | H10H 29/10 | 257/E33.012 |
| 2013/0277692 A1 * | 10/2013 | Chang | H01L 25/0756 | 257/89 |
| 2013/0285010 A1 * | 10/2013 | Lu | H01L 25/0756 | 257/E33.012 |
| 2014/0008613 A1 * | 1/2014 | Sheu | H10H 20/811 | 257/17 |
| 2015/0288146 A1 * | 10/2015 | Chang-Hasnain | H01S 5/18319 | 438/27 |
| 2019/0164944 A1 * | 5/2019 | Chae | H01L 25/13 | |
| 2020/0365647 A1 * | 11/2020 | Jang | H10H 29/14 | |
| 2020/0365649 A1 * | 11/2020 | Jang | H10H 20/831 | |
| 2021/0082887 A1 * | 3/2021 | Jang | H01L 25/0756 | |
| 2021/0125972 A1 * | 4/2021 | Jang | H01L 24/32 | |
| 2022/0285433 A1 * | 9/2022 | Lee | G09G 3/32 | |
| 2023/0074033 A1 * | 3/2023 | Hsueh | H10F 39/103 | |
| 2023/0402437 A1 * | 12/2023 | Jang | H01L 24/33 | |
| 2024/0088197 A1 * | 3/2024 | Jang | H10H 20/01335 | |
| 2024/0113150 A1 * | 4/2024 | Cha | H01L 25/167 | |
| 2025/0040288 A1 * | 1/2025 | Soer | H10H 20/812 | |

* cited by examiner

OPTOELECTRONIC DEVICE

TECHNICAL FIELD

The disclosure relates to an optoelectronic device, and particularly to an optoelectronic device with an optical structure.

CROSS REFERENCE TO RELATED APPLICATION

This application claims the right of priority based on TW application Ser. No. 110133573, filed on Sep. 9, 2021, and the content of which is hereby incorporated by reference in its entirety.

DESCRIPTION OF BACKGROUND ART

Nowadays, collections of light-emitting device and photodetector in different wavelength ranges are widely applied in the field of sensing technology, such as gas detection or biosensing. With the popularity of wearable electronics and the increasing demand for real-time health monitor, manufacturers integrated several light-emitting devices and photodetectors of different wavelength in one device through advanced package technology, so as to meet market demands for multi-functional electronics. However, such a multi-chip-integrated package technology not only leads relatively high cost, but also has difficulty reducing device volume which limits the application of the products.

SUMMARY OF THE DISCLOSURE

The present disclosure provides an optoelectronic device. The optoelectronic device includes a substrate, a first semiconductor stack located on the substrate, a second semiconductor stack located on the first semiconductor stack, and a first optical structure located between the first semiconductor stack and the second semiconductor stack. The first semiconductor stack includes a first semiconductor layer, a second semiconductor layer and a first active layer located between the first semiconductor layer and the second semiconductor layer, and the first active layer emits or absorbs a first light with a first wavelength. The second semiconductor stack includes a third semiconductor layer, a fourth semiconductor layer and a second active layer located between the third semiconductor layer and the fourth semiconductor layer, and the second active layer emits or absorbs a second light with a second wavelength smaller than the first wavelength. The first optical structure includes a plurality of first parts and a plurality of second parts. The first parts and the second parts are alternately arranged by a first period along a horizontal direction parallel to the substrate.

BRIEF DESCRIPTION OF THE DRAWINGS

The foregoing aspects and many of the attendant advantages of the present disclosure will become more readily appreciated as the same becomes better understood by reference to the following detailed description, when taken in conjunction with the accompanying drawings, wherein.

DETAILED DESCRIPTION OF PREFERRED EMBODIMENTS

Figure 1:
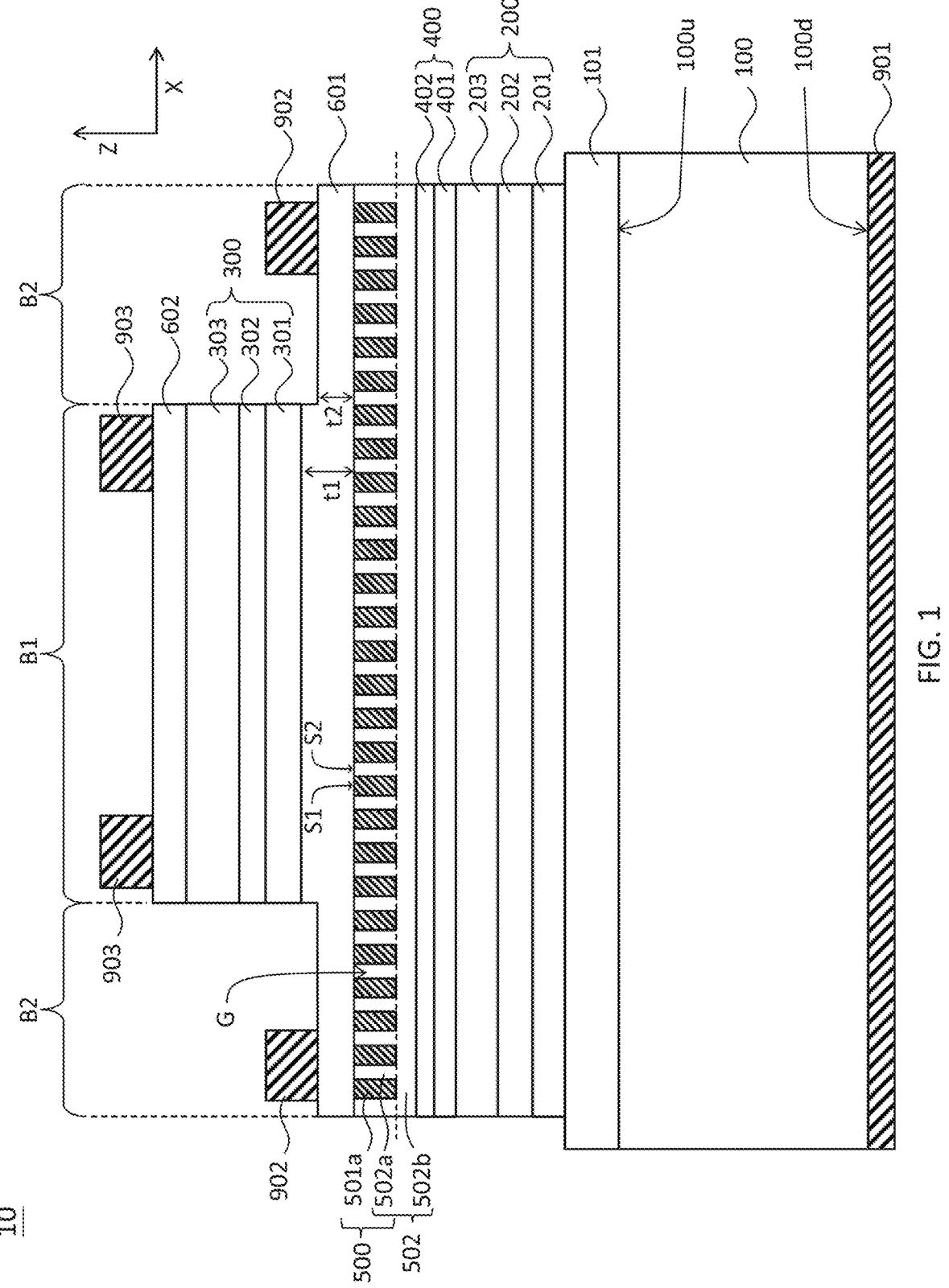
FIG. 1 shows a cross-sectional view of an optoelectronic device disclosed in one embodiment in accordance with the present disclosure.

Exemplary embodiments of the present disclosure will be described in detail with reference to the accompanying drawings hereafter. The following embodiments are given by way of illustration with Cartesian Coordinates (X, Y, Z axes) to help those skilled in the art fully understand the spirit of the present disclosure. Hence, it should be noted that the present disclosure is not limited to the embodiments herein and can be realized in various forms. Further, the drawings are not precise scale and components may be exaggerated in view of width, height, length, etc. Herein, the similar or identical reference numerals will denote the similar or identical components throughout the drawings. In the embodiments of the present disclosure, if not described otherwise, the term "horizontal" means any value or vector along X-axis, Y-axis or on X-Y plane, while the term "vertical" means any value or vector along Z-axis. The term "coplanar" may be used to describe surfaces of different elements are vertically on the same level.

Figure 2:
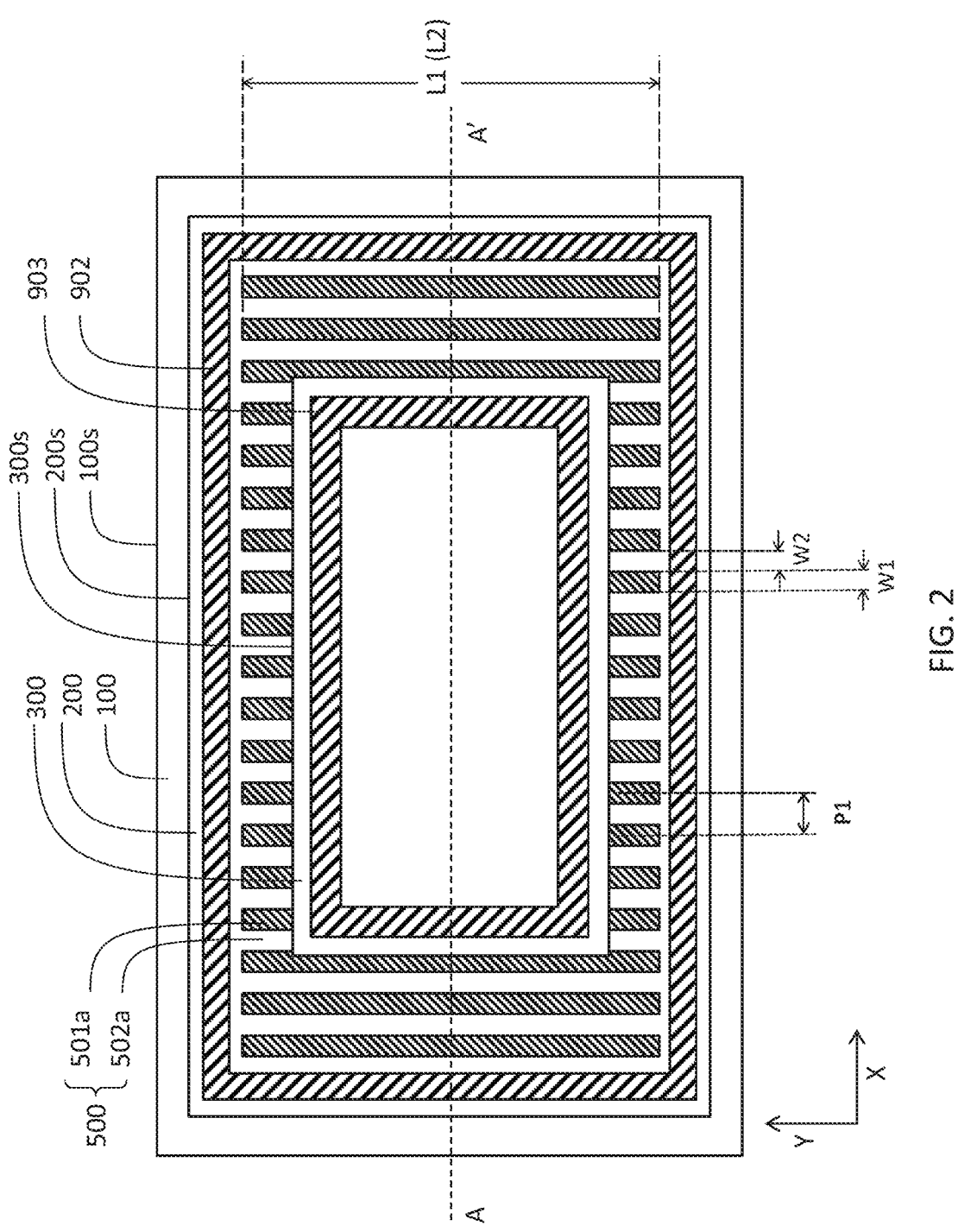
FIG. 2 shows a top view of the optoelectronic device in FIG. 1.

FIGS. 1 and 2 respectively show a cross-sectional view and a top view of an optoelectronic device 10 in one embodiment in accordance with the present disclosure, wherein FIG. 1 is the cross-sectional view of the optoelectronic device 10 along A-A' line shown in FIG. 2. The optoelectronic device 10 includes a substrate 100, a first semiconductor stack 200, a second semiconductor stack 300 and a first optical structure 500. The substrate 100 includes a top surface 100$u$ and a bottom surface 100$d$ opposite to the top surface 100$u$, and the top surface 100$u$ is parallel to X-Y plane and perpendicular to Z-axis. The first semiconductor stack 200 is disposed on the top surface 100$u$ of the substrate 100 and includes a first semiconductor layer 201, a second semiconductor layer 203, and a first active layer 202 located between the first semiconductor layer 201 and the second semiconductor layer 203. The first active layer 202 has a first energy gap Eg1 so that the first active layer 202 can emit or absorb a first light I1 with a first wavelength C1. More specifically, the first light I1 with the first wavelength C1 has an energy equal to that of the first energy gap Eg1. When the optoelectronic device 10 is a light-emitting device such as a light-emitting diode, the first active layer 202 can emit the first light I1. When the optoelectronic device 10 is a photo detector, the first active layer 202 can absorb the first light I1 or lights having a wavelength smaller than the first wavelength C1 to generate a first current i1. The second semiconductor stack 300 is disposed on the first semiconductor stack 200 and includes a third semiconductor layer 301, a fourth semiconductor layer 303, and a second active layer 302 located between the third semiconductor layer 301 and the fourth semiconductor layer 303. The second active layer 302 has a second energy gap Eg2 so that the second active layer 302 can emit or absorb a second light I2 with a second wavelength C2. In more details, the second light I2 with the second wavelength C2 has an energy equal to that of the second energy gap Eg2. When the optoelectronic device 10 is a light-emitting device, the second active layer

302 can emit the second light I2. When the optoelectronic device 10 is a photo detector, the second active layer 302 can absorb the second light I2 or lights having a wavelength smaller than the second wavelength C2 to generate a second current i2. In addition, the first energy gap Eg1 is equal or smaller than the second energy gap Eg2 and the first wavelength C1 is equal or greater than the second wavelength C2. In one embodiment, a difference between the first wavelength C1 and the second wavelength C2 is greater than 300 nm, or a difference between the first energy gap Eg1 and the second energy gap Eg2 is greater than 0.35 eV. Besides, along X-axis, the first active layer 202 has a width greater than that of the second active layer 302.

The first optical structure 500 is disposed between the first semiconductor stack 200 and the second semiconductor stack 300, and substantially has optical functions that only lights in a specific range of wavelength can pass through. Referring to FIG. 2, along X-axis, the first optical structure 500 has a width, which is greater than a width of the second semiconductor stack 300 and no greater than a width of the first semiconductor stack 200. For instance, a ratio of the width of the first optical structure 500 to the width of the first semiconductor stack 200 can be in a range of 0.8 to 1.0. In addition, as shown in FIG. 2, the substrate 100, the first semiconductor stack 200 and the second semiconductor stack 300 respectively have a substrate boundary 100*s*, a first outer boundary 200*s* and a second outer boundary 300*s*. The first optical structure 500 occupies a region which is within the first outer boundary 200*s* and exceeds the second outer boundary 300*s*. In one embodiment, the first optical structure 500 has an occupied area which is 60% to 100% of an area surrounded by the first outer boundary 200*s* of the first semiconductor stack 200.

Referring to FIG. 1, the first optical structure 500 includes a plurality of first parts 501*a* and a plurality of second parts 502*a*, and the plurality of first parts 501*a* and the plurality of second parts 502*a* are alternately arranged along a horizontal direction, e.g., X-axis. More specifically, the plurality of first parts 501*a* are formed by patterning a first structural layer (not shown). The plurality of first parts 501*a* are separated from each other and any two adjacent first parts 501*a* are separated by a gap G. Then, a second structural layer 502 is formed and includes a first portion filled in the gaps G between the adjacent first parts 501*a* to form the plurality of second parts 502*a*. In another embodiment, the second structural layer 502 further includes a second portion 502*b* located between the first semiconductor stack 200 and the first optical structure 500, and the second portion 502*b* connects the first parts 501*a* and the second parts 502*a*. Besides, the first structural layer and the plurality of first parts 501*a* have the same physical and chemical characteristics, such as refractive index, chemical composition, conductivity type, conductivity or intrinsic lattice constant. The second structural layer 502, the second parts 502*a* and the second portion 502*b* have the same physical and chemical characteristics, such as refractive index, chemical composition, conductivity type, conductivity or intrinsic lattice constant.

In one embodiment, the first parts 501*a* and the second parts 502*a* respectively have a first refractive index n1 and a second refractive index n2, and the second refractive index n2 is greater than the first refractive index n1, e.g., (n2-n1) >0.2. In addition, both the first refractive index n1 and the second refractive index n2 vary with different wavelengths. In one embodiment, the first parts 501*a* and the second parts 502*a* respectively have a first refractive index n1' and a second refractive index n2' under the first wavelength C1, and the difference therebetween is a first refractive index difference Y1 (absolute value). Similarly, under the second wavelength C2, the first parts 501*a* and the second parts 502*a* respectively have a first refractive index n1" and a second refractive index n2", and the difference therebetween is a second refractive index difference Y2. Wherein, the first refractive index difference Y1 is greater than the second refractive index difference Y2, e.g., (Y1-Y2)>0.5, for achieving a better optical effect. Furthermore, the plurality of first parts 501*a* or the in plurality of second parts 502*a* are periodically arranged along the horizontal direction by a first period P1. The first period P1 is a distance between the centers of two adjacent first parts 501*a*, or a distance between the centers of two adjacent second parts 502*a*.

Referring to FIG. 2, in one embodiment, the first parts 501*a* are strip structures having a first length L1 and a first width W1, and the first length L1 is much greater than the first width W1. The second parts 502*a* also includes strip structures having a second length L2 and a second width W2, and the second length L2 is equal to the first length L1 and much greater than the second width W2. The second width W2 has a range defined by Equation I shown below:

$$0.7\left(\frac{C1}{4*n2}\right) \le W2 \le 1.3\left(\frac{C1}{4*n2}\right) \qquad \text{(Equation I)}$$

The first width W1 is substantially equal to the second width W2, and the first period P1 is the sum of the first width W1 and the second width W2. In one embodiment, the first width W1 can be between 50 nm to 300 nm, such as 100 nm, 150 nm or 200 nm. The first period P1 can be between 100 nm to 600 nm, such as 200 nm, 300 nm or 400 nm. In one embodiment, the first optical structure 500 is a one-dimension array such as optical grating, and is passable only for lights with a wavelength close to the first wavelength C1. Namely, the first optical structure 500 filters lights with a wavelength much deviating from the first wavelength C1, so as to narrow the wavelength spectrum distribution of passing lights. For instance, when the first wavelength C1 is in mid-wavelength infrared (MWIR) range, lights with a wavelength in a range of the first wavelength C1±500 nm can pass the first optical structure 500. When the first wavelength C1 is in short-wavelength infrared (SWIR) range, lights with a wavelength in a range of the first wavelength C1±200 nm can pass the first optical structure 500.

The arrangement of the plurality of first parts 501*a* is not limited to one-dimension array. For instance, the plurality of first parts 501*a* can be arranged as a two-dimension array, and each of the first parts 501*a* can be a square having a length equal to the first width W1 or a circle having a diameter equal to the first width W1. In one embodiment, the second structural layer 502 or the second parts 502*a* connects the first semiconductor stack 200 and the second semiconductor stack 300 through an epitaxial stacking manner. More specifically, the first semiconductor stack 200, the second structural layer 502 (or the plurality of second parts 502*a*) and the second semiconductor stack 300 are epitaxy structures grown in one continuous epitaxy process, so the interfaces therebetween show characteristics of epitaxial stacking. Besides, each of the first parts 501*a* has a first surface S1 towards the second semiconductor stack 300, and each of the second parts 502*a* has a second surface S2 towards the second semiconductor stack 300. The first surface S1 and the second surface S2 can be coplanar. In one embodiment, the first parts 501*a* can be metal nitride such as TiN. The second parts 502*a* can be III-V semiconductors such as InP. In addition, the first parts 501*a* has a conductivity greater than that of the second parts 502*a*. The second parts 502*a* has a first conductivity type, such as p-type. In one embodiment, the conductivity of the first parts 501*a* is in a range of $10^3$ to $10^6$ $\Omega^{-1}\text{cm}^{-1}$, and the conductivity of the second parts 502*a* is in a range of $10^{-7}$ to $10^3$ $\Omega^{-1}\text{cm}^{-1}$. Moreover, the second parts 502*a* and the third semiconductor layer 301 are lattice matched. The second parts 502*a* and the third semiconductor layer 301 respectively have lattice constants, or the difference of lattice constant therebetween is less than 0.5 Å. As used herein, "lattice constant" refers to the intrinsic lattice constant of a lattice structure without internal or external strain.

Specifically, the second semiconductor layer 203 and the third semiconductor layer 301 are close to the first optical structure 500, and the first semiconductor layer 201 and the fourth semiconductor layer 303 are away from the first optical structure 500. The second semiconductor layer 203, the second structural layer 502, and the third semiconductor layer 301 have the first conductivity type, and the first semiconductor layer 201 and the fourth semiconductor layer 303 have a second conductivity type. The first conductivity type is opposite to the second conductivity type. For example, the first conductivity type can be p-type which has holes as main carriers, and the second conductivity type can be n-type which has electrons as main carriers. In other embodiment, the first conductivity type and the second conductivity type might be n-type and p-type respectively.

In one embodiment, the optoelectronic device 10 further includes a first contact layer 601 and a second contact layer 602. The first contact layer 601 is disposed between the first optical structure 500 and the third semiconductor layer 301 of the second semiconductor stack 300 to provide electrical contact therebetween and provide electrical contact with electrodes disposed subsequently. The first contact layer 601 has the first conductivity type such as p-type. Besides, the first contact layer 601 has a doping concentration greater than that of the third semiconductor layer 301. The second contact layer 602 is disposed on the fourth semiconductor layer 303 and has the second conductivity type such as n-type. Moreover, the second contact layer 602 has a doping concentration greater than that of the fourth semiconductor layer 303 to provide electrical contact for electrodes formed subsequently.

In one embodiment, the first contact layer 601 directly contacts the third semiconductor layer 301. The third semiconductor layer 301 includes a Group III element such as Indium, while the first contact layer 601 does not include the Group III element. In one embodiment, the first contact layer 601 can be an etching stop layer for patterning the second semiconductor stack 300, and includes a first region B1 and a second region B2. The first region B1 contacts the third semiconductor layer 301 of the second semiconductor stack 300 while the second region B2 does not. The first contact layer 601 includes a first thickness t1 in the first region B1 and a second thickness t2 in the second region B2, and the second thickness t2 is smaller than the first thickness t1. A ratio of the second thickness t2 to the first thickness t1 is between 0.5 to 1, such as 0.6, 0.7, 0.8 or 0.9.

The optoelectronic device 10 may further include a lattice buffer structure 400 located between the second semiconductor layer 203 and the second structural layer 502 of the first optical structure 500. The lattice buffer structure 400 includes a first buffer layer 401, and the first buffer layer 401 has a lattice constant between the lattice constants of the second structural layer 502 and the second semiconductor layer 203. In one embodiment, the lattice buffer structure 400 further includes a second buffer layer 402 located between the first buffer layer 401 and the second structural layer 502, wherein the lattice constant of the second buffer layer 402 is between the lattice constant of the first buffer layer 401 and the lattice constant of the second structural layer 502. In one embodiment, a lattice constant difference between the second semiconductor layer 203 and the second structural layer 502 is greater than 0.4 Å, and the lattice buffer structure 400 is applied to reduce defect density and lattice strain caused by lattice mismatch between the second semiconductor layer 203 and the second structural layer 502. Therefore, the epitaxy quality and the yield of the optoelectronic device 10 can be improved.

The first buffer layer 401 and the second buffer layer 402 have the first conductivity type such as p-type. In another embodiment, a first Group V element exists in the second structural layer 502 and the second buffer layer 402 but not in the first buffer layer 401. Moreover, a second Group V element exists in the second buffer layer 402 and the first buffer layer 401 but not in the second structural layer 502. The first Group V element can be phosphorus and the second Group V element can be antimony. In one embodiments, the second semiconductor layer 203 includes $In_xGa_{(1-x)}As_ySb_{(1-y)}$ (0≤x, y≤1), the first buffer layer 401 includes GaSb, the second buffer layer includes $In_xGa_{(1-x)}SbyP_{(1-y)}$(0≤x≤1; 0<y<1), and the second structural layer 502 includes InP.

The optoelectronic device 10 may further include a bonding layer 101 to connect the substrate 100 and the first semiconductor stack 200. The bonding layer 101 can be conductive materials, such as metal, metal oxide or alloys. In one embodiment, the substrate 100 is a carrier substrate so the material selection thereof is not limited by the epitaxial requirements of the first semiconductor stack 200 or the second semiconductor stack 300, such as the lattice constant. More specifically, the second semiconductor stack 300 and the first semiconductor stack 200 are epitaxially grown on a growth substrate (not shown) in sequence. The bonding layer 101 is then disposed on the substrate 100 or on the first semiconductor stack 200 to connect the substrate 100 and the first semiconductor stack 200 together. The growth substrate is removed for following processes.

The optoelectronic device 10 may further include a first electrode 901, a second electrode 902 and a third electrode 903. The first electrode 901 is disposed on the bottom surface 100*d* of the substrate 100 and electrically connects to the first semiconductor layer 201. The second electrode 902 is disposed on the first contact layer 601 and electrically connects to the second semiconductor layer 203 and the third semiconductor layer 301. The third electrode 903 is disposed on the second contact layer 602 and electrically connects the fourth semiconductor layer 303. In one embodiment, when the optoelectronic device 10 is a light-emitting device, the first active layer 202 is driven by a voltage or a current generated between the first electrode 901 and the second electrode 902 to emit the first light I1, and the second active layer 302 is driven by another voltage or another current generated between the third electrode 903 and the second electrode 902 to emit the second light I2. In another embodiment, when the optoelectronic device 10 is a photodetector, the first active layer 202 can absorb the first light I1 or lights with a wavelength less than the first wavelength C1 to generate electron-hole pairs, and the first electrode 901 and the second electrode 902 respectively receive electrons and holes, or holes and electrons, to generate the first current i1. Similarly, the second active layer 302 can absorb the second light I2 or lights with a wavelength less than the second wavelength C2 to generate electron-hole pairs, and the third electrode 903 and the second electrode 902 respectively receive electrons and holes, or holes and electrons, to generate the second current i2.

In applications, the optoelectronic device 10 can be a light-emitting device or a photodetector, and the first light I1 with the first wavelength C1 and the second light I2 with the second wavelength C2 can be invisible light, e.g., lights in near infrared (NIR) range from 800 nm to 1000 nm, lights in short-wavelength infrared (SWIR) range from 1100 nm to 1500 nm, or lights in middle-wavelength infrared (MWIR) range from 2500 nm to 3500 nm. In one embodiment, the optoelectronic device 10 is a photodetector in which first wavelength C1 and the second wavelength C2 are respectively in SWIR range and NIR range, so the optoelectronic device 10 can be applied to bio-geometric features detection or vein positioning. In another embodiment, the optoelectronic device 10 is a light-emitting device in which the first wavelength C1 and the second wavelength C2 are respectively in MWIR range and SWIR range, so that the optoelectronic device 10 can be applied as light sources in security and surveillance fields. Moreover, the first active layer 202 and the second active layer 302 includes $In_x$ $Ga_{(1-x)}Sb$ (0≤x≤1) or $In_xGa_{(1-x)}As_ySb_{(1-y)}$ (0≤x, y≤1), and the ratio of different elements can be adjusted so the first wavelength C1 and the second wavelength C2 can be determined by application requirements. When the first active layer 202 or the second active layer 302 are multi-quantum well (MQW) containing $In_xGa_{(1-x)}Sb$ (0.1≤X≤0.9) and $In_xAs_ySb_{(1-y)}$ (0.05≤y≤0.35), the first wavelength C1 or the second wavelength C2 are in MWIR range. When the first active layer 202 or the second active layer 302 are multi-quantum well (MQW) containing $In_xGa_{(1-x)}As_ySb_{(1-y)}$ (0.1≤x≤0.6, 0.25≤y≤0.8) and $GaAs_zSb_{(1-z)}$(0.05≤z≤0.65), the first wavelength C1 or the second wavelength C2 are in SWIR range. Or, when the first active layer 202 or the second active layer 302 are multi-quantum well (MQW) containing $In_xGa_{(1-x)}$ $As_zP_wSb_{(1-z-w)}$(0.05≤x≤0.3, 0.5≤z≤1, 0.05≤w≤0.5) and $In_{(1-x-y)}Al_xGa_yAs_zP_wSb_{(1-z-w)}$ (0.05≤x≤0.2, 0.5≤y≤1, 0.05≤z≤1, 0.5≤w≤1), the first wavelength C1 or the second wavelength C2 are in NIR range.

Figure 3:
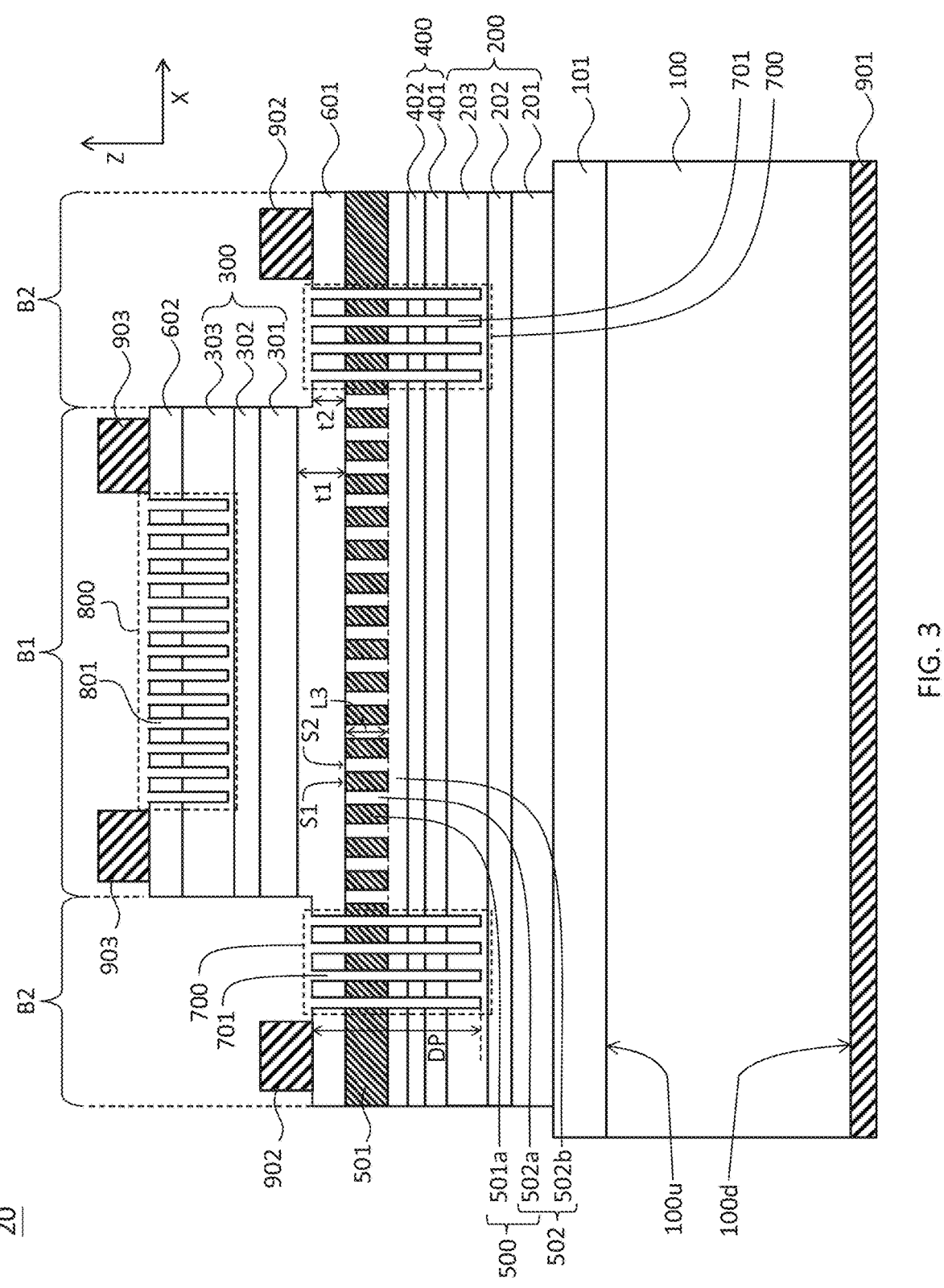
FIG. 3 shows a cross-sectional view of an optoelectronic device disclosed in another embodiment in accordance with the present disclosure.
Figure 4:
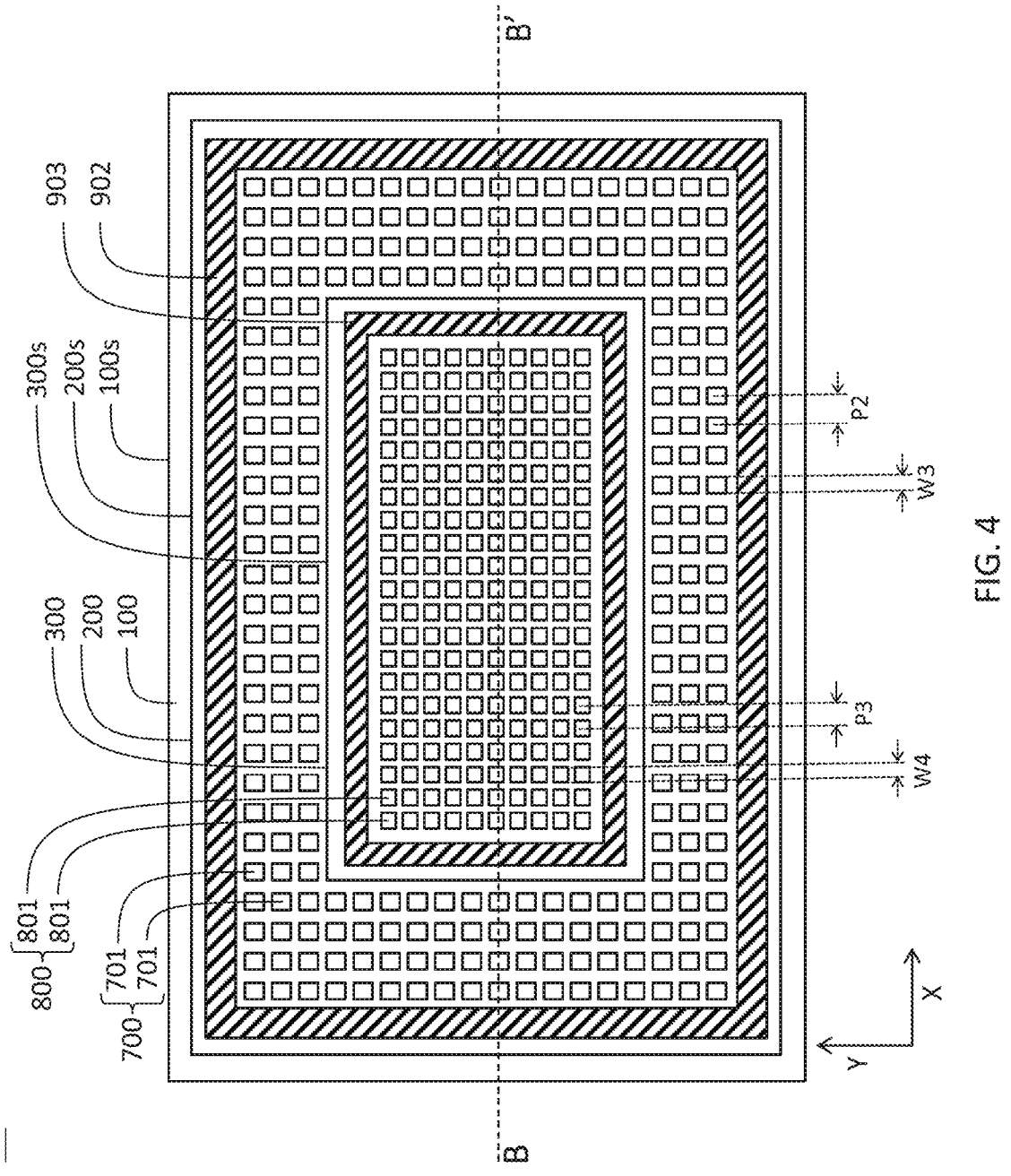
FIG. 4 shows a top view of the optoelectronic device in FIG. 3.

FIGS. 3 and 4 respectively show a cross-sectional view and a top view of an optoelectronic device 20 in another embodiment in accordance with the present disclosure, wherein FIG. 3 is the cross-sectional view of the optoelectronic device 20 along B-B' line shown in FIG. 4. Referring to FIG. 3, the optoelectronic device 20 includes a substrate 100, a first semiconductor stack 200, a second semiconductor stack 300, a first optical structure 500 and a second optical structure 700. The substrate 100 includes a top surface 100u and a bottom surface 100d opposite to the top surface 100u, and the top surface 100u is parallel to X-Y plane and perpendicular to Z-axis. The first semiconductor stack 200 is disposed on the top surface 100u of the substrate 100, and includes a first semiconductor layer 201, a second semiconductor layer 203, and a first active layer 202 located between the first semiconductor layer 201 and the second semiconductor layer 203. The first active layer 202 has a first energy gap Eg1 so that the first active layer 202 can emit or absorb a first light I1 with a first wavelength C1. More specifically, the first light I1 with the first wavelength C1 has an energy equal to that of the first energy gap Eg1. When the optoelectronic device 20 is a light-emitting device, the first active layer 202 can emit the first light I1. When the optoelectronic device 20 is a photo detector, the first active layer 202 can absorb the first light I1 or lights having a wavelength smaller than the first wavelength C1 to generate a first current i1. The second semiconductor stack 300 is disposed on the first semiconductor stack 200 and includes a third semiconductor layer 301, a fourth semiconductor layer 303, and a second active layer 302 located between the third semiconductor layer 301 and the fourth semiconductor layer 303. The second active layer 302 has a second energy gap Eg2 so that the second active layer 302 can emit or absorb a second light I2 with a second wavelength C2. In more details, the second light I2 with the second wavelength C2 has an energy equal to that of the second energy gap Eg2. When the optoelectronic device 20 is a light-emitting device, the second active layer 302 can emit the second light I2. When the optoelectronic device 10 is a photo detector, the second active layer 302 can absorb the second light I2 or lights having a wavelength smaller than the second wavelength C2 to generate a second current i2. In addition, the first energy gap Eg1 is equal or smaller than the second energy gap Eg2 and the first wavelength C1 is equal or greater than the second wavelength C2. In one embodiment, a difference between the first wavelength C1 and the second wavelength C2 is greater than 300 nm, or a difference between the first energy gap Eg1 and the second energy gap Eg2 is greater than 0.35 eV. Besides, along X-axis, the first active layer 202 has a width greater than that of the second active layer 302.

Figure 5:
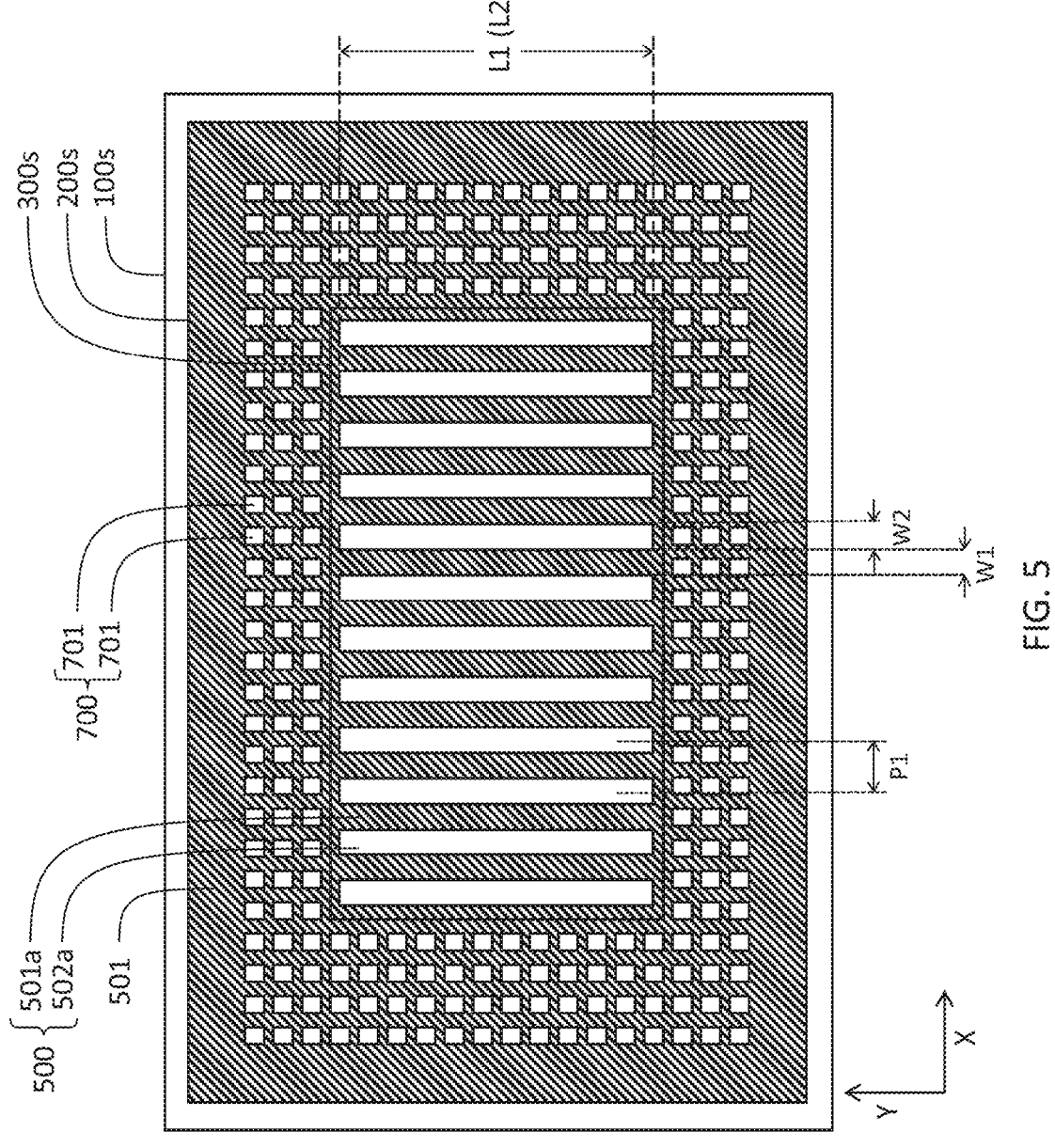
FIG. 5 shows relative positions of a first optical structure and a second optical structure of the optoelectronic device in FIG. 3.

Referring to FIG. 5 for a schematic depicts relative positions of the first semiconductor stack 200, the second semiconductor stack 300, the first optical structure 500 and the second optical structure 700. As shown in FIG. 5, on X-Y plane, the first optical structure 500 occupies a region within the second outer boundary 300s of the second semiconductor stack 300. Besides, as shown in FIG. 3, the first optical structure 500 is disposed between the first semiconductor stack 200 and the second semiconductor stack 300, and includes the plurality of first parts 501a and the plurality of second parts 502a which are alternately arranged along the horizontal direction. More specifically, the plurality of first parts 501a are formed by patterning the first structural layer 501. The plurality of first parts 501a are separated from each other by the gap G. Then, the second structural layer 502 is formed and includes the first portion filled in the gaps G between the adjacent first parts 501a to form the plurality of second parts 502a. In another embodiment, the second structural layer 502 further includes the second portion 502b located between the first semiconductor stack 200 and the first optical structure 500, and the second portion 502b connects the first parts 501a and the second parts 502a. Besides, the first structural layer 501 and the plurality of first parts 501a have the same physical and chemical characteristics, such as refractive index, chemical composition, conductivity type, conductivity or intrinsic lattice constant. The second structural layer 502, the second parts 502a and the second portion 502b have the same physical and chemical characteristics, such as refractive index, chemical composition, conductivity type, conductivity or intrinsic lattice constant.

In one embodiment, the first parts 501a and the second parts 502a respectively have the first refractive index n1 and the second refractive index n2, and the second refractive index n2 is greater than the first refractive index n1, e.g., (n2-n1)>0.2. In addition, both the first refractive index n1 and the second refractive index n2 vary with different wavelengths. In one embodiment, the first parts 501a and the second parts 502a respectively have the first refractive index n1' and the second refractive index n2' under the first wavelength C1, and the difference therebetween is the first refractive index difference Y1 (absolute value). Similarly, under the second wavelength C2, the first parts 501a and the second parts 502a respectively have the first refractive index n1" and the second refractive index n2", and the difference therebetween is the second refractive index difference Y2. Wherein, the first refractive index difference Y1 is greater than the second refractive index difference Y2, e.g., (Y1-Y2)>0.5, for achieving a better optical effect. Furthermore, the plurality of first parts 501a or the plurality of second parts 502a are periodically arranged with a first period P1. The first period P1 is, along the horizontal direction, a distance between the centers of two adjacent first parts 501a, or a distance between the centers of two adjacent second parts 502a.

Referring to FIG. 5, in one embodiment, the first parts 501a are strip structures having the first length L1 and the first width W1, and the first length L1 is much greater than the first width W1. The second parts 502a also includes strip structures having the second length L2 and the second width W2, and the second length L2 is equal to the first length L1 and much greater than the second width W2. The second width W2 has a range defined by Equation II shown below:

$$0.7\left(\frac{C1}{4*n2}\right) \le W2 \le 1.3\left(\frac{C1}{4*n2}\right) \qquad \text{(Equation II)}$$

The first width W1 is substantially equal to the second width W2, and the first period P1 is the sum of the first width W1 and the second width W2. Except the range defined by Equation II, the first width W1 also can be between 75 nm to 750 nm, such as 150 nm or 375 nm. The first period P1 also can be between 150 nm to 1500 nm, such as 300 nm or 750 nm. In one embodiment, the first optical structure 500 may include photonic crystal and can be a one-dimension array such as optical grating, and is able to filter (by reflection or refraction) lights with a wavelength greater than the first wavelength C1. For instance, when the first wavelength C1 is in MWIR range such as 2000 nm, lights with a wavelength greater than 2000 nm can be filtered. When the first wavelength C1 is in SWIR range such as 1300 nm, lights with a wavelength greater than 1300 nm can be filtered.

The arrangement of the plurality of first parts 501a is not limited to one-dimension array. For instance, the plurality of first parts 501a can be arranged as a two-dimension array, and each of the first parts 501a can be a square having a length equal to the first width W1 or a circle having a diameter equal to the first width W1. In one embodiment, the second structural layer 502 or the second parts 502a connects the first semiconductor stack 200 and the second semiconductor stack 300 through an epitaxial stacking manner. More specifically, the first semiconductor stack 200, the second structural layer 502 (or the plurality of second parts 502a) and the second semiconductor stack 300 are epitaxy structures grown in one continuous epitaxy process so the interfaces therebetween show characteristics of epitaxial stacking. Besides, each of the first parts 501a has the first surface S1 towards the second semiconductor stack 300 and each of the second parts 502a has the second surface S2 towards the second semiconductor stack 300. The first surface S1 and the second surface S2 can be coplanar. In one embodiment, the first parts 501a can be metal nitride such as TiN. The second parts 502a can be III-V semiconductors such as InP. In addition, the first parts 501a has a conductivity greater than that of the second parts 502a. The second parts 502a has the first conductivity type, such as p-type. In one embodiment, the conductivity of the first parts 501a is in a range of $10^3$ to $10^6 \Omega^{-1}\text{cm}^{-1}$, and the conductivity of the second parts 502a is in a range of $10^{-7}$ to $10^3 \Omega^{-1}\text{cm}^{-1}$. Moreover, the second parts 502a and the third semiconductor layer 301 are lattice matched. The second parts 502a and the third semiconductor layer 301 respectively have lattice constants, or the difference of lattice constant therebetween is less than 0.5 Å.

Specifically, the second semiconductor layer 203 and the third semiconductor layer 301 are close to the first optical structure 500, and the first semiconductor layer 201 and the fourth semiconductor layer 303 are away from the first optical structure 500. The second semiconductor layer 203, the second structural layer 502 and the third semiconductor layer 301 are the first conductivity type, and the first semiconductor layer 201 and the fourth semiconductor layer 303 are the second conductivity type opposite to the first conductivity type. In this embodiment, the first conductivity type can be p-type with holes as main carriers, and the second conductivity type can be n-type with electrons as main carriers. In other embodiment, the first conductivity type and the second conductivity type might be n-type and p-type respectively.

In one embodiment, the optoelectronic device 20 further includes the first contact layer 601 and the second contact layer 602. The first contact layer 601 is disposed between the first optical structure 500 and the third semiconductor layer 301 of the second semiconductor stack 300 to provide electrical contact therebetween and provide electrical contact for the second electrode 902. The first contact layer 601 has the first conductivity type such as p-type. Besides, the first contact layer 601 has a doping concentration greater than that of the third semiconductor layer 301. The second contact layer 602 is disposed on the fourth semiconductor layer 303 and has the second conductivity type such as n-type. Moreover, the second contact layer 602 has a doping concentration greater than that of the fourth semiconductor layer 303 to provide ohmic contact for the third electrode 903.

In one embodiment, the first contact layer 601 directly contacts the third semiconductor layer 301. The third semiconductor layer 301 includes the Group III element such as Indium, while the first contact layer 601 does not include the Group III. In one embodiment, the first contact layer 601 can be an etching stop layer for patterning the second semiconductor stack 300, and includes the first region B1 and the second region B2. The first region B1 contacts the third semiconductor layer 301 of the second semiconductor stack 300 while the second region B2 does not. The first contact layer 601 includes the first thickness t1 in the first region B1 and the second thickness t2 in the second region B2, and the second thickness t2 is smaller than the first thickness t1. A ratio of the second thickness t2 to the first thickness t1 is between 0.5 to 1, such as 0.6, 0.7, 0.8 or 0.9. Besides, the first semiconductor stack 200 includes a covered region covered by the second semiconductor stack 300 and an exposed region which is not covered by the second semiconductor stack 300. The covered region and the exposed region of the first semiconductor stack 200 are respectively corresponding to the first region B1 and the second region B2 of the first contact layer 601. In one embodiment, the first optical structure 500 is located on both the covered region and the exposed region.

Referring to FIGS. 3 and 4, in one embodiment, the optoelectronic device 20 further includes a second optical structure 700 disposed on the first contact layer 601. The second optical structure 700 includes a plurality of first recesses 701 periodically arranged along X-axis and Y-axis to form a two-dimension matrix (the Y-axis is parallel to the top surface 100*u* and perpendicular to the X-Z plane shown in FIG. 3). More specifically, the first recesses 701 are separated from each other and arranged with a second period P2, which is a distance between centers of two adjacent first recesses 701 in X-axis or Y-axis. As FIGS. 4 and 5 show, in this embodiment, the second optical structure 700 is located between the first outer boundary 200*s* and the second outer boundary 300*s*. In other words, the second optical structure 700 is corresponding to the exposed region of the first semiconductor stack 200 and surrounds the first optical structure 500.

Referring to FIG. 3, in one embodiment, the first recesses 701 penetrate the first contact layer 601, the first structural layer 501, the second structural layer 502 and the lattice buffer structure 400 to the second semiconductor layer 203, so along X-axis each of the first recesses 701 is surrounded by the first contact layer 601, the first structural layer 501, the second structural layer 502, the lattice buffer structure 400 and the second semiconductor layer 203. In one embodiment, the first recesses 701 extends from the first contact layer 601 to the second semiconductor layer 203, and can reach at least half of the thickness of the second semiconductor layer 203. In another embodiment, along Z-axis, the first recesses 701 have a depth DP larger than a third length L3 of the first parts 501*a* shown in FIG. 3. The bottoms of the first recesses 701 are lower than the bottoms of the first parts 501*a*, and the openings of the first recesses 701 are higher than the tops of the first parts 501*a*. Referring to FIG. 4, the first recesses 701 have a third width W3 which can be in a range defined by Equation III shown below:

$$0.7\left(\frac{C1}{4*n3}\right) \le W3 \le 1.3\left(\frac{C1}{4*n3}\right) \qquad \text{(Equation III)}$$

Wherein n3 is a third refractive index of the second semiconductor layer 203, and the third width W3 is not equal to the second period P2. In one embodiment, the third width W3 can be between 100 nm to 1000 nm, such as 200 nm or 500 nm. And the second period P2 can be in a range of 400 nm to 2000 nm, such as 800 nm or 1000 nm. Besides, in the top view, the first recesses 701 can be formed in circle or regular polygon, such as square shown in FIG. 4. In other embodiments, the second optical structure 700 may further include photonic crystal to fill the first recesses 701. The second optical structure 700 substantially have optical functions, and is passable only for lights with a wavelength close to the first wavelength C1. In other words, the second optical structure 700 filters lights with a wavelength much deviating from the first wavelength C1, so as to narrow the wavelength spectrum distribution of passing lights. For instance, when the first wavelength C1 is in MWIR range, lights with a wavelength in a range of the first wavelength C1±500 nm can pass the second optical structure 700. When the first wavelength C1 is in SWIR range, lights with a wavelength in a range of the first wavelength C1±200 nm can pass the second optical structure 700.

Referring to FIGS. 3 and 4, in one embodiment, the optoelectronic device 20 further includes a third optical structure 800 disposed on the second contact layer 602, thus the second active layer 302 is located between the first optical structure 500 and the third optical structure 800. In one embodiment, in top view shown in FIG. 4, the third optical structure 800 is located within the second outer boundary 300*s* and is surrounded by the second optical structure 700. The third optical structure 800 includes a plurality of second recesses 801. Each of the second recesses 801 penetrates the second contact layer 602 to the fourth semiconductor layer 303, and is surrounded by the second contact layer 602 and the fourth semiconductor layer 303. In one embodiment, the second recesses 801 can reach at least half of the thickness of the fourth semiconductor layer 303. Furthermore, the second recesses 801 have a fourth width W4 which can be in a range defined by Equation IV shown below:

$$0.7\left(\frac{C2}{4*n4}\right) \le W4 \le 1.3\left(\frac{C2}{4*n4}\right) \qquad \text{(Equation IV)}$$

Wherein n4 is a fourth refractive index of the fourth semiconductor layer 303. The second recesses 801 are separated from each other, and are periodically arranged along X-axis and Y-axis to form a two-dimension matrix. The second recesses 801 are arranged with a third period P3, which is a distance between centers of two adjacent second recesses 801 in X-axis or Y-axis. And the third period P3 is different from the second period P2. In one embodiment, the fourth width W4 can be between 50 nm to 500 nm, such as 100 nm or 250 nm. And the third period P3 can be between 200 nm to 1000 nm, such as 400 nm or 500 nm. In addition, in the top view, the second recesses 801 can be formed in circle or regular polygon, such as square shown in FIG. 4. In one embodiment, the third optical structure 800 may include photonic crystal to fill the second recesses 801. The third optical structure 800 substantially have optical functions, and is passable only for lights with a wavelength close to the second wavelength C2. In other words, the third optical structure 800 filters lights with a wavelength much deviating from the second wavelength C2, thus the third optical structure 800 can narrow the wavelength spectrum distribution of passing lights. For instance, when the second wavelength C2 is in WIR range, lights with a wavelength in a range of the second wavelength C2±200 nm can pass the third optical structure 800. When the second wavelength C2 is in NIR range, lights with a wavelength in a range of the second wavelength C2±100 nm can pass the third optical structure 800.

The optoelectronic device 20 may further include the lattice buffer structure 400 located between the second semiconductor layer 203 and the second structural layer 502 of the first optical structure 500. The lattice buffer structure 400 includes the first buffer layer 401, which has a lattice constant between the lattice constants of the second structural layer 502 and the second semiconductor layer 203. In one embodiment, the lattice buffer structure 400 further includes a second buffer layer 402 located between the first buffer layer 401 and the second structural layer 502, wherein the lattice constant of the second buffer layer 402 is between the lattice constant of the first buffer layer 401 and the lattice constant of the second structural layer 502. In one embodiment, a lattice constant difference between the second semiconductor layer 203 and the second structural layer 502 is greater than 0.4 Å, and the lattice buffer structure 400 is applied to reduce defect density and lattice strain caused by lattice mismatch between the second semiconductor layer 203 and the second structural layer 502. Therefore, the epitaxy quality and the yield of the optoelectronic device 20 can be improved. In addition, the first buffer layer 401 and the second buffer layer 402 have the first conductivity type such as p-type. In another embodiment, the first Group V element exists in the second structural layer 502 and the second buffer layer 402 but not in the first buffer layer 401. Besides, the second Group V element exists in the second buffer layer 402 and the first buffer layer 401 but not in the second structural layer 502. The first Group V element can be phosphorus and the second Group V element can be antimony. In one embodiments, the second semiconductor layer 203 includes $In_xGa_{(1-x)}As_ySb_{(1-y)}$ ($0\leq x$, $y\leq 1$), the first buffer layer 401 includes GaSb, the second buffer layer includes $In_xGa_{(1-x)}SbyP_{(1-y)}$ ($0\leq x\leq 1$; $0<y<1$), and the second structural layer 502 includes InP.

The optoelectronic device 20 may further include the bonding layer 101 to connect the substrate 100 and the first semiconductor stack 200. The bonding layer 101 can be conductive material, such as metal, metal oxide or alloys. In one embodiment, the substrate 100 is a carrier substrate so the material selection thereof is not limited by the epitaxial requirements of the first semiconductor stack 200 or the second semiconductor stack 300, such as the lattice constant. More specifically, the second semiconductor stack 300 and the first semiconductor stack 200 are epitaxially grown on a growth substrate (not shown) in sequence. The bonding layer 101 is then disposed on the substrate 100 or on the first semiconductor stack 200 to connect the substrate 100 and the first semiconductor stack 200 together, then the growth substrate is removed for subsequent processes.

The optoelectronic device 20 may further include the first electrode 901, the second electrode 902, and the third electrode 903. The first electrode 901 is disposed on the bottom surface 100d of the substrate 100 and electrically connects to the first semiconductor layer 201. The second electrode 902 is disposed on the first contact layer 601 and electrically connects to the second semiconductor layer 203 and the third semiconductor layer 301. The third electrode 903 is disposed on the second contact layer 602 and electrically connects the fourth semiconductor layer 303. In one embodiment, when the optoelectronic device 20 is a light-emitting device, the first active layer 202 is driven by a voltage or a current generated between the first electrode 901 and the second electrode 902 to emit the first light I1, and the second active layer 302 is driven by another voltage or current generated between the third electrode 903 and the second electrode 902 to emit the second light I2. In another embodiment, when the optoelectronic device 20 is a photodetector, the first active layer 202 can absorb the first light I1 or lights with a wavelength less than the first wavelength C1 to generate electron-hole pairs, and the first electrode 901 and the second electrode 902 respectively receive electrons and holes, or holes and electrons, to generate the first current i1. Similarly, the second active layer 302 can absorb the second light I2 or lights with a wavelength less than the second wavelength C2 to generate electron-hole pairs, and the third electrode 903 and the second electrode 902 respectively receive electrons and holes, or holes and electrons, to generate the second current i2

In applications, the optoelectronic device 20 can be a light-emitting device or a photodetector, and the first light I1 with the first wavelength C1 and the second light I2 with the second wavelength C2 can be invisible light, e.g., lights in NIR range from 800 nm to 1000 nm, lights in SWIR range from 1100 nm to 1500 nm, or lights in MWIR range from 2500 nm to 3500 nm. In one embodiment, the optoelectronic device 20 is a photodetector in which first wavelength C1 and the second wavelength C2 are respectively in SWIR range and NIR range so the optoelectronic device 20 can be applied to bio-geometric features detection or vein positioning. In another embodiment, the optoelectronic device 20 is a light-emitting device in which the first wavelength C1 and the second wavelength C2 are respectively in MWIR range and SWIR range so that the optoelectronic device 20 can be applied as light sources in security and surveillance fields. Moreover, the first active layer 202 and the second active layer 302 includes $In_xGa_{(1-x)}Sb$ ($0\leq x\leq 1$), $In_xGa_{(1-x)}As_ySb_{(1-y)}$ ($0\leq x$, $y\leq 1$), $In_xGa_{(1-x)}As_zP_wSb_{(1-z-w)}$ ($0\leq x\leq 1$, $0\leq z\leq 1$, $0\leq w\leq 1$) or $In_{(1-x-y)}Al_xGa_yAs_zP_wSb_{(1-z-w)}$ ($0\leq x\leq 0$, $0\leq y\leq 1$, $0\leq z\leq 1$, $0\leq w\leq 1$), and the ratio of different elements can be adjusted so the first wavelength C1 and the second wavelength C2 can be determined by application requirements. When the first active layer 202 or the second active layer 302 are multi-quantum well (MQW) containing $In_xGa_{(1-x)}Sb$ ($0.1\leq X\leq 0.9$) and $In_xAs_ySb_{(1-y)}$ ($0.05\leq y\leq 0.35$), the first wavelength C1 or the second wavelength C2 are in MWIR range. When the first active layer 202 or the second active layer 302 are multi-quantum well (MQW) containing $In_xGa_{(1-x)}As_ySb_{(1-y)}$ ($0.1\leq x\leq 0.6$, $0.25\leq y\leq 0.8$) and $GaAs_zSb_{(1-z)}$ ($0.05\leq z\leq 0.65$), the first wavelength C1 or the second wavelength C2 are in SWIR range. Or, when the first active layer 202 or the second active layer 302 are multi-quantum well (MQW) containing $In_xGa_{(1-x)}As_zP_wSb_{(1-z-w)}$ ($0.05\leq x\leq 0.3$, $0.5\leq z\leq 1$, $0.05\leq w\leq 0.5$) and $In_{(1-x-y)}Al_xGa_yAs_zP_wSb_{(1-z-w)}$ ($0.05\leq x\leq 0.2$, $0.5\leq y\leq 1$, $0.05\leq z\leq 1$, $0.5\leq w\leq 1$), the first wavelength C1 or the second wavelength C2 are in NIR range.

For all the embodiments mentioned above, the first active layer 202 or the second active layer 302 can be a single heterostructure (SH), a double heterostructure (DH) or multiple quantum wells (MQW).

For all the embodiments mentioned above, the first electrode 901, the second electrode 902 and the third electrode 903 can includes metals with low resistance, and can be single-layer structure or multi-layer stacking structure. For example, the metals can include but are not limited to Au, Al, Pt, Cr, Ti, Ni, W or combination of the abovementioned metals.

For all the embodiments mentioned above, the substrate 100 and the bonding layer 101 can be conductive materials, including metals, alloys, semiconductors, or conductive metal compound. Furthermore, the bonding layer 101 can be single-layer structure or multi-layer stacking structure.

The embodiments of the present disclosure will be described in detail below with reference to the drawings. In the descriptions of the specification, specific details are provided for a full understanding of the present disclosure. The same or similar components in the drawings will be denoted by the same or similar symbols. It is noted that the drawings are for illustrative purposes only and do not represent the actual dimensions or quantities of the components. Some of the details may not be fully sketched for the conciseness of the drawings.

What is claimed is:

1. An optoelectronic device, comprising:
a substrate having a top surface and a bottom surface;
a first semiconductor stack located on the top surface and including a first semiconductor layer, a second semiconductor layer and a first active layer located between the first semiconductor layer and the second semiconductor layer, wherein the first active layer emits or absorbs a first light having a first wavelength;
a second semiconductor stack located on the first semiconductor stack and including a third semiconductor layer, a fourth semiconductor layer and a second active layer located between the third semiconductor layer and the fourth semiconductor layer, wherein the second active layer emits or absorbs a second light which has a second wavelength smaller than the first wavelength; and a first optical structure located between the first semiconductor stack and the second semiconductor stack, and including a plurality of first parts and a plurality of second parts which are alternately arranged with a first period along a horizontal direction parallel to the top surface, wherein the first optical structure overlaps with the second semiconductor stack along a vertical direction.

2. The optoelectronic device according to claim 1, further comprising a first contact layer disposed between the first optical structure and the third semiconductor layer.

3. The optoelectronic device according to claim 2, wherein the first contact layer includes a first region contacting the third semiconductor layer and a second region which does not contact the third semiconductor layer, and the first region and the second region respectively have a first thickness and a second thickness, and the second thickness is less than the first thickness.

4. The optoelectronic device according to claim 2, further comprising:

a first electrode disposed on the bottom surface of the substrate and electrically connecting the first semiconductor layer;

a second electrode disposed on the first contact layer and electrically connecting with the second semiconductor layer and the third semiconductor layer; and a third electrode disposed on the fourth semiconductor layer and electrically connecting the fourth semiconductor layer.

5. The optoelectronic device according to claim 1, wherein the plurality of first parts has an electric conductivity greater than that of the plurality of second parts.

6. The optoelectronic device according to claim 1, further comprising a structural layer, the structural layer including:

a first portion formed the plurality of second parts; and a second portion located between the first portion and the first semiconductor stack and connected with the plurality of first parts and the plurality of second parts.

7. The optoelectronic device according to claim 6, further comprising a first buffer layer located between the structural layer and the first semiconductor stack, wherein the first buffer layer has a lattice constant between a lattice constant of the structural layer and a lattice constant of the second semiconductor layer.

8. The optoelectronic device according to claim 1, wherein the first semiconductor stack, the plurality of second parts and the second semiconductor stack are epitaxially formed along the vertical direction perpendicular to the top surface of the substrate.

9. The optoelectronic device according to claim 1, wherein the plurality of second parts and the third semiconductor layer respectively have lattice constants, and a difference therebetween is less than 0.5 Å.

10. The optoelectronic device according to claim 1, wherein the plurality of second parts has a first width, and the first width is in a range of $$0.7\left(\frac{C1}{4*n2}\right) \text{ to } 1.3\left(\frac{C1}{4*n2}\right),$$

wherein C1 is the first wavelength and n2 is a refraction index of the plurality of second parts.

11. The optoelectronic device according to claim 1, wherein the first semiconductor stack includes a covered region corresponding to the second semiconductor stack and an exposed region; wherein the optoelectronic device further includes a second optical structure located on the exposed region of the first semiconductor stack, and the second optical structure includes a plurality of first trenches periodically arranged with a second period along the horizontal direction, and the second period is different from the first period.

12. The optoelectronic device according to claim 11, wherein the second optical structure includes two-dimensional photonic crystals.

13. The optoelectronic device according to claim 11, wherein the plurality of first trenches has a second width, and the second width is in a range of $$0.7\left(\frac{C1}{4*n3}\right) \text{ to } 1.3\left(\frac{C1}{4*n3}\right),$$

wherein C1 is the first wavelength and n3 is a refraction index of the plurality of first trenches.

14. The optoelectronic device according to claim 1, wherein the first wavelength is in a range of 1100 nm to 1500 nm, and the second wavelength is in a range of 800 nm to 1000 nm.

15. The optoelectronic device according to claim 1, wherein the first wavelength is in a range of 2500 nm to 3500 nm, and the second wavelength is in a range of 1100 nm to 1500 nm.

16. The optoelectronic device according to claim 1, wherein each of the plurality of first parts has a first surface towards the second semiconductor stack and each of the plurality of second parts has a second surface towards the second semiconductor stack, and the first surface and the second surface are coplanar.

17. The optoelectronic device according to claim 1, wherein the plurality of first parts comprises metal nitride, and the plurality of second parts comprises semiconductor.

18. The optoelectronic device according to claim 1, wherein along the horizontal direction the first optical structure has a width larger than that of the second semiconductor stack.

19. The optoelectronic device according to claim 1, wherein the plurality of first parts and the plurality of second parts have a first refractive index and a second refractive index respectively, and the second refractive index is greater than the first refractive index.

20. The optoelectronic device according to claim 19, wherein a first refractive index difference is formed between the first refractive index and the second refractive index under the first wavelength, and a second refractive index difference is formed between the first refractive index and the second refractive index under the second wavelength, and the first refractive index difference is greater than the second refractive index difference.

* * * * *